United States Patent
Nishihara et al.

(10) Patent No.: US 6,949,990 B2
(45) Date of Patent: Sep. 27, 2005

(54) FILTER DEVICE

(75) Inventors: Tokihiro Nishihara, Kawasaki (JP);
Tsuyoshi Yokoyama, Kawasaki (JP);
Takeshi Sakashita, Kawasaki (JP);
Tsutomu Miyashita, Kawasaki (JP);
Yoshio Satoh, Kawasaki (JP)

(73) Assignees: Fujitsu Media Device Limited, Yokohama (JP); Fujitsu Limited, Kawasaki (JP)

( * ) Notice: Subject to any disclaimer, the term of this patent is extended or adjusted under 35 U.S.C. 154(b) by 5 days.

(21) Appl. No.: 10/665,209

(22) Filed: Sep. 22, 2003

(65) Prior Publication Data

US 2004/0104790 A1 Jun. 3, 2004

(30) Foreign Application Priority Data

Sep. 20, 2002 (JP) .................................... 2002-276381

(51) Int. Cl.[7] ................................................ H03H 9/56
(52) U.S. Cl. ...................................... 333/189; 333/191
(58) Field of Search ................................ 333/186–192; 310/320, 366

(56) References Cited

U.S. PATENT DOCUMENTS

| | | | | |
|---|---|---|---|---|
| 5,872,493 A | * | 2/1999 | Ella | 333/191 |
| 5,942,958 A | * | 8/1999 | Lakin | 333/189 |
| 6,081,171 A | * | 6/2000 | Ella | 333/189 |
| 6,509,813 B2 | * | 1/2003 | Ella et al. | 333/187 |
| 6,550,664 B2 | * | 4/2003 | Bradley et al. | 310/322 |
| 6,731,046 B2 | * | 5/2004 | Watanabe et al. | 310/313 R |
| 6,817,071 B2 | * | 11/2004 | Taga | 29/25.35 |
| 2003/0058066 A1 | * | 3/2003 | Taniguchi et al. | 333/193 |

FOREIGN PATENT DOCUMENTS

| | | | | |
|---|---|---|---|---|
| EP | 1076414 A2 | * | 2/2001 | H03H/9/64 |
| JP | 5-183380 | | 5/1993 | |
| JP | 2002-141771 | | 5/2002 | |

* cited by examiner

*Primary Examiner*—Seungsook Ham
(74) *Attorney, Agent, or Firm*—Arent Fox PLLC

(57) ABSTRACT

A filter device includes a filter element that has piezoelectric thin-film resonators arranged in series arms and parallel arms, and a package that houses the filter element in a face-down state. In this filter device, the filter element and the package are electrically connected to each other through bumps. The package includes first pad parts on which the bumps are placed, and transmission paths that electrically connect the first pad parts to the outside. The filter element includes second pad parts that are electrically connected to the first pad parts through the bumps, and wiring parts that electrically connect the second pads to the piezoelectric thin-film resonators and electrically connect the piezoelectric thin-film resonators to one another. In this structure, inductances formed with the transmission paths are connected in series to the piezoelectric thin-film resonators.

19 Claims, 7 Drawing Sheets

FILTER DEVICE

BACKGROUND OF THE INVENTION

1. Field of the Invention

The present invention generally relates to a filter device, and more particularly, to a filter device that has piezoelectric thin-film resonators housed in a package.

2. Description of the Related Art

It has been widely known that a ladder-type surface acoustic wave (SAW) filter element having single-terminal pair SAW resonators (hereinafter referred to simply as "resonators") arranged in series arms and parallel arms can exhibit filter characteristics in a broader band area, with inductance components being connected in series to the resonators arranged in series arms or parallel arms. It has also been known that, with those inductance components, the filter characteristics can be highly restrained in the vicinity of pass bands.

Japanese Unexamined Patent Publication No. 5-183380 (hereinafter referred to as "Prior Art 1"), for example, discloses a structure having the inductance components (L101 through L105 shown in FIG. 1) formed with bonding wires that connect the electrode terminals of the surface acoustic wave filter element and the electrode terminals of the package. FIG. 1 illustrates the circuit structure of the ladder-type SAW filter device 100 disclosed by Prior Art 1.

To obtain a smaller device, it is also effective to connect the electrode terminals of a surface acoustic wave filter element to the electrode terminals of a package with bumps, with the surface acoustic wave filter element facing down. Japanese Unexamined Patent Publication No. 2002-141771 (hereinafter referred to as "Prior Art 2"), for example, discloses this type of structure. FIGS. 2 through 4 illustrate the ladder-type SAW filter device 200 disclosed by Prior Art 2. FIG. 2 is a section view of the ladder-type SAW filter device 200, taken along the transmission direction of surface acoustic wave (SAW). FIG. 3 is a top view (surface B) of a ladder-type SAW filter element 201 that is mounted on the ladder-type SAW filter device 200. FIG. 4 shows a die-attach face A of a package 202 that houses the ladder-type SAW filter element 201.

As shown in FIG. 2, the ladder-type SAW filter device 200 has the ladder-type SAW filter element 201 face-down bonded to the die-attach face A of the package 202 with bumps 203. To connect an inductance component in series to each resonator 214 shown in FIG. 3, microstrip lines 220 are formed on the die-attach face A of the package 202 in Prior Art 2, as shown in FIG. 4.

In the surface acoustic wave filter element 201 of Prior Art 2, however, wires 210 between the surface acoustic wave resonators 214 and wires 210 between the surface acoustic wave resonators 214 and bump connecting pads 213 might be long, as shown in FIG. 3. In that case, the wires 210 function as inductances, adversely affecting the filter characteristics of the surface acoustic wave filter device 200.

More specifically, the wires 210 are normally formed by performing a vapor-phase epitaxy process on a thin film in the same stage as forming comb-like electrodes 211 and reflection electrodes 212 of the surface acoustic wave resonators 214. Therefore, the film thicknesses of the wires 210 are 0.05 $\mu$m to 0.5 $\mu$m. Such wires 210 formed with thin films have large resistance losses, and function as inductances with poor Q characteristics. In the disclosure of Prior Art 2, the filter characteristics of the surface acoustic wave filter device 200 deteriorate due to the addition of inductances with poor Q characteristics.

In the disclosure of Prior Art 2, bump connecting pads 221 formed on the die-attach face A of the package 202 occupy quite large areas to secure a predetermined precision in the production process, as shown in FIG. 4. More specifically, a margin is allowed for the positioning accuracy in the bonding process using the bumps 203, and the sizes of the bump connecting pads 221 are increased accordingly. When the ladder-type SAW filter element 201 is face-down bonded to the package 202 using the bumps 203, the conductor pattern (the comb-like electrodes 211 and the reflection electrodes 212) formed on the surface B of the ladder-type SAW filter element 201 faces the bump connecting pads 221 on the package 202, resulting in a problem of large stray capacitance that adversely affects the filter characteristics of the surface acoustic wave filter device 200.

Further, the ladder-type SAW filter element 201 disclosed by Prior Art 2 has a substrate made of $LiTaO_3$ or $LiNbO_3$ having a large dielectric constant of 30 to 50. When the ladder-type SAW filter element 201 is face-down bonded to the package 202, the stray capacitance generated in the conductor pattern on the die-attach face A of the package 202 becomes large, and adversely affects the filter characteristics of the surface acoustic wave filter device 200.

SUMMARY OF THE INVENTION

It is therefore an object of the present invention to provide a filter device in which the above disadvantage is eliminated.

A more specific object of the present invention is to provide a small-size filter device that exhibits excellent filter characteristics in a broader band area, and has the filter characteristics highly restrained in the vicinity of pass bands.

The above objects of the present invention are achieved by a filter device comprising: a filter element that has a plurality of piezoelectric thin-film resonators arranged in series arms and parallel arms; and a package that houses the filter element in a face-down state, the filter element and the package being electrically connected to each other through bumps, the package having a plurality of first pad parts on which the bumps are placed, and a plurality of transmission paths that electrically connect the first pad parts to the outside, the filter element having a plurality of second pad parts that are electrically connected to the first pad parts through the bumps, and a plurality of wiring parts that electrically connect the second pads to the piezoelectric thin-film resonators and electrically connect the piezoelectric thin-film resonators to one another, and inductances formed with the transmission paths being connected in series to the piezoelectric thin-film resonators.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of a preferred embodiment of the present invention, with reference to the accompanying drawings.

In this embodiment, a filter device employs a bandpass ladder filter element having single-terminal pair piezoelectric thin-film resonators arranged in series arms and parallel arms.

A general single-terminal pair piezoelectric thin-film resonator has a substrate and a thin-film laminated resonator formed on the substrate. The laminated resonator includes a piezoelectric film and a pair of electrode films (an upper electrode film and a lower electrode film) that sandwich the piezoelectric film. The substrate has a cavity at a location under the laminated resonator.

When an ac voltage is applied to the upper and lower electrodes of the single-terminal pair piezoelectric thin-film resonator, the piezoelectric film sandwiched between the upper and lower electrodes generates thickness longitudinal vibration due to a reverse piezoelectric effect, causing electric resonance characteristics.

Figure 1:
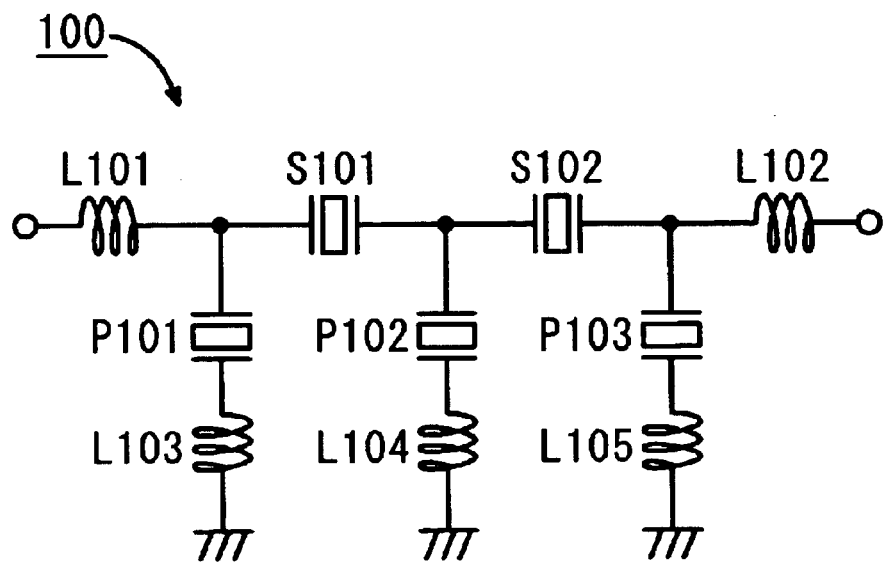
FIG. 1 is a circuit diagram illustrating the structure of a ladder-type SAW filter device in accordance with Prior Art 1.
Figure 2:
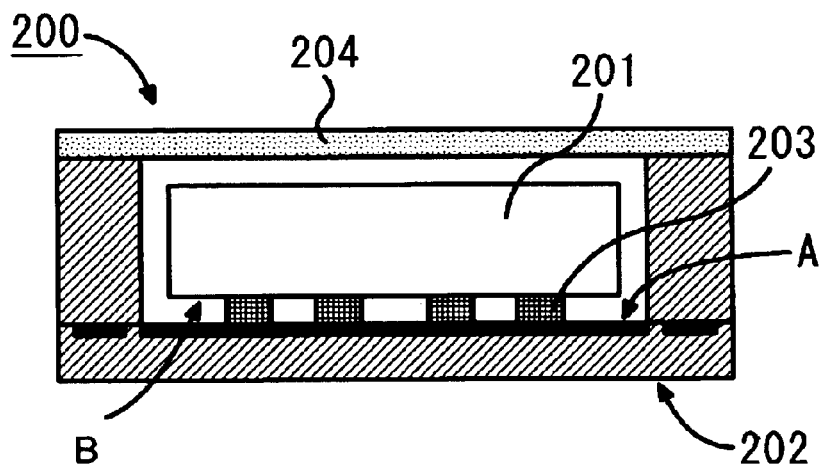
FIG. 2 is a section view of a ladder-type SAW filter device in accordance with Prior Art 2, taken along the transmission direction of surface acoustic wave.
Figure 3:
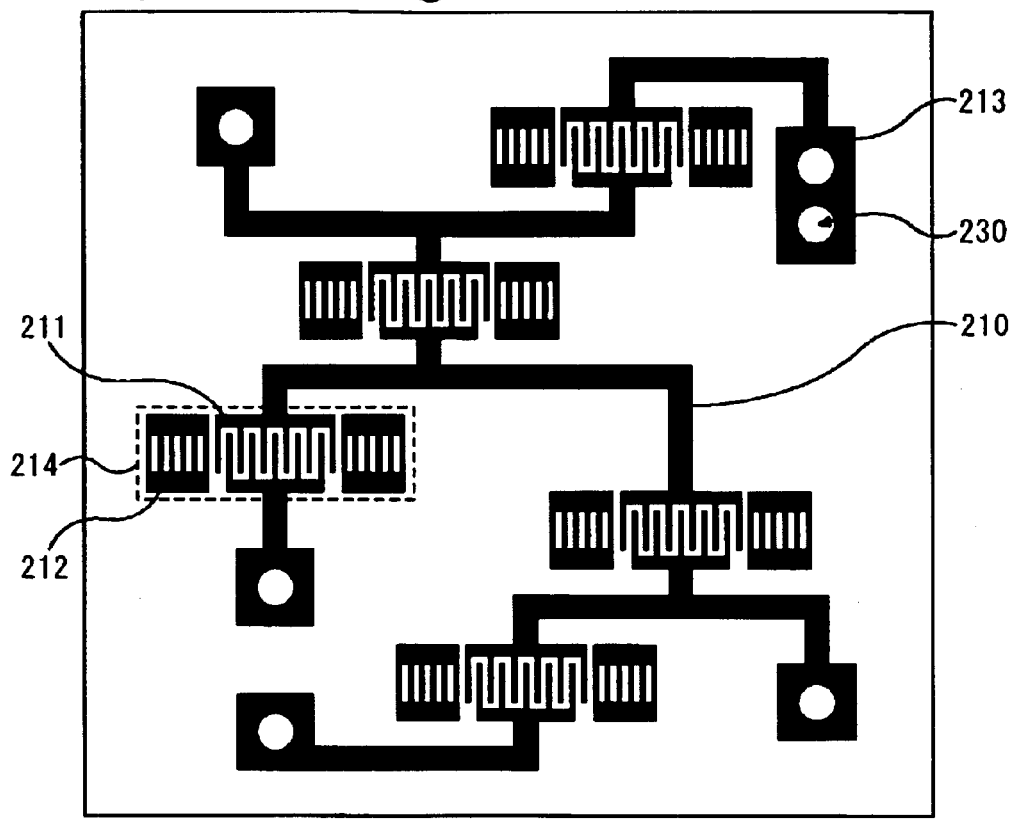
FIG. 3 is a top view of a ladder-type SAW filter element to be mounted on the ladder-type SAW filter device shown in FIG. 2.
Figure 4:
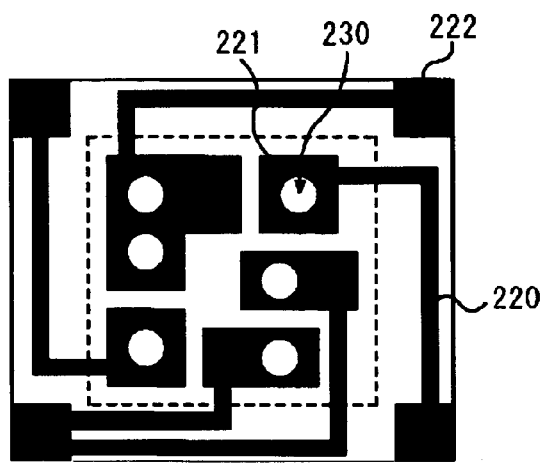
FIG. 4 shows the die-attach face of a package that houses the ladder-type SAW filter element shown in FIG. 3.
Figure 5:
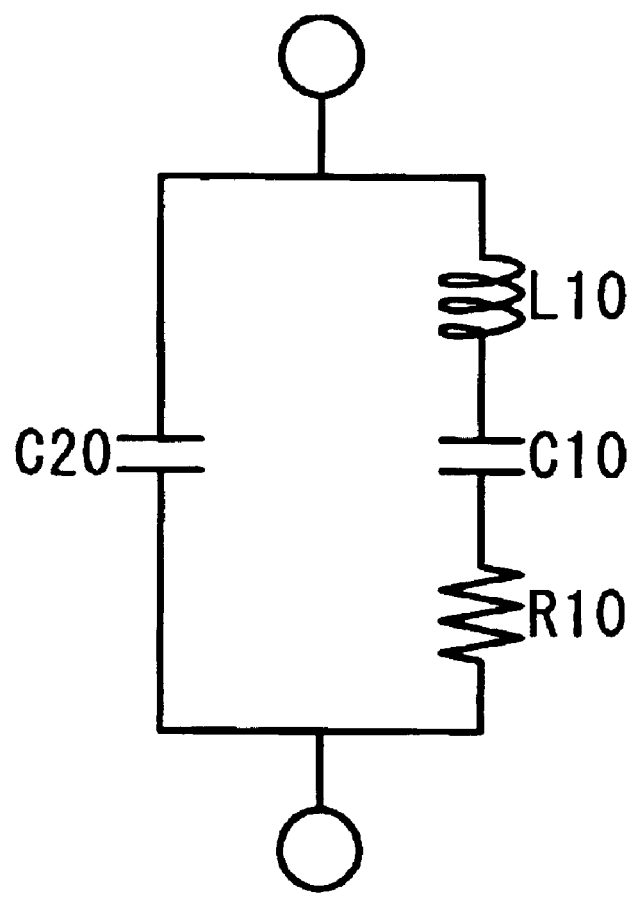
FIG. 5 shows an equivalent circuit of a general single-terminal pair piezoelectric thin-film resonator.

The above single-terminal pair piezoelectric thin-film resonator can be represented by an equivalent circuit having double resonance characteristics, as shown in FIG. 5. Accordingly, bandpass filter characteristics can be obtained by arranging single-terminal pair piezoelectric thin-film resonators in series arms and parallel arms in a ladder circuit.

Figure 6:
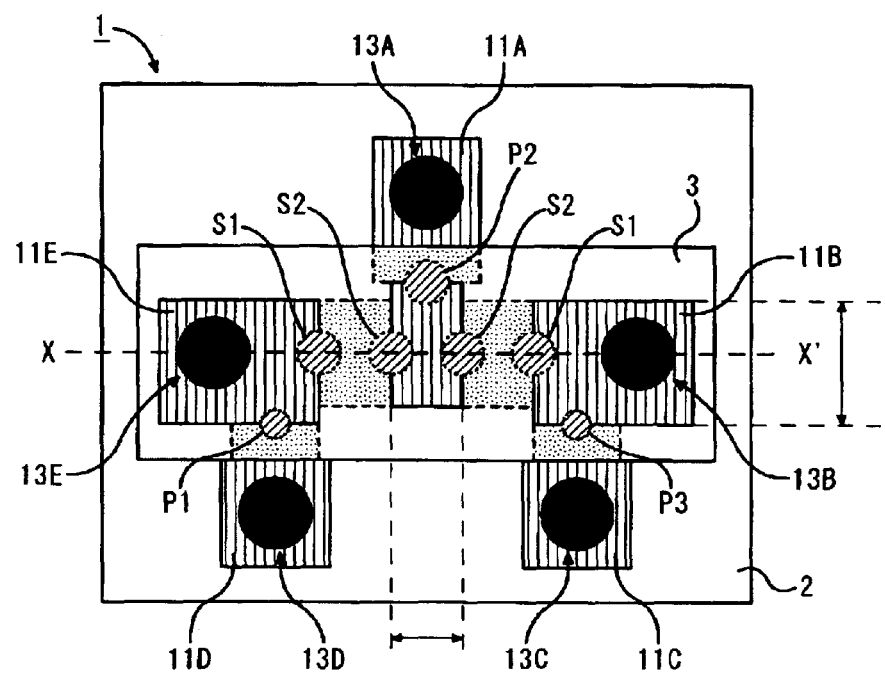
FIG. 6 is a top view of a bandpass ladder filter element in accordance with an embodiment of the present invention.
Figure 7:
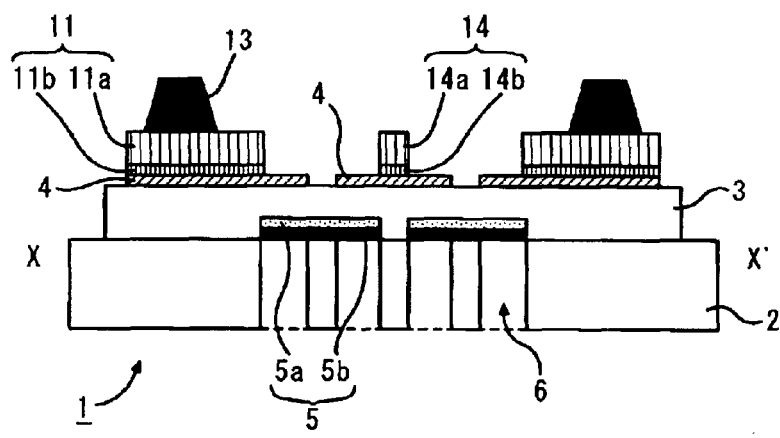
FIG. 7 is a section view of the bandpass ladder filter element, taken along the line X–X' of FIG. 6.
Figure 8:
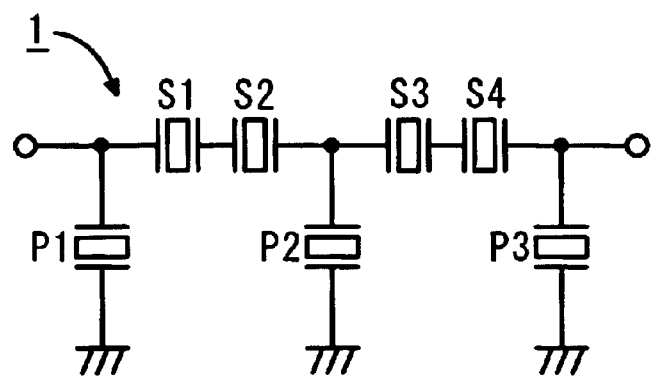
FIG. 8 shows an equivalent circuit of the bandpass ladder filter element shown in FIG. 6.

In the following, this embodiment will be described in greater detail. FIG. 6 is a top view of a bandpass ladder filter element 1 in accordance with this embodiment. FIG. 7 is a section view of the bandpass ladder filter element 1, taken along the line X–X' of FIG. 6. FIG. 8 shows an equivalent circuit of the bandpass ladder filter element 1.

As shown in FIG. 6, the bandpass ladder filter element 1 has four piezoelectric thin-film resonators arranged in series arms and three piezoelectric thin-film resonators arranged in parallel arms. The resonators in series arms (hereinafter referred to as the "series-arm resonators") S1 through S4 are aligned in a row. One resonator P2 of the resonators in parallel arms (hereinafter referred to as the "parallel-arm resonators") P1 through P3 is placed on one side of the row of the series-arm resonators S1 through S4, and the other parallel-arm resonators P1 and P3 are placed on the other side. With the series-arm resonators being aligned in a row and the parallel-arm resonators being placed on either side of the row of the series-arm resonators, the distances among the bump connecting pads and the distance between each bump connecting pad and the transmission path on the die-attach face can be kept long enough to prevent the generation of stray capacitance. The facing area between the electrode pattern of the face-down-mounted filter element and the transmission paths on the die-attach face is also reduced to restrain the generation of stray capacitance.

Referring now to FIG. 7, the layer structure of the bandpass ladder filter element 1 and the layer structure of each of the series-arm resonators S1 through S4 will be described in detail. The parallel-arm resonators P1 through P3 each has the same structure as the series-arm resonators S1 through S3, and therefore, explanation of them will be omitted in this description.

In FIG. 7, the substrate 2 of the bandpass ladder filter element 1 is a single-crystal silicon (Si) substrate having a dielectric constant of approximately 13, for example. Other than the single-crystal silicon (Si) substrate, a substrate made of any material having a dielectric constant of 20 or lower can be used, as long as not departing from the scope of the present invention. A dielectric constant of 20 or lower is a reference value for adequately restraining the generation of stray capacitance between the filter element and the package.

Lower electric films 5 each having a double-layered structure of a molybdenum (Mo) layer 5a and an aluminum (Al) layer 5b are patterned on the substrate 2. A piezoelectric film 3 made of aluminum nitride (AlN) is stacked on the lower electrode films 5 and the part of the substrate 2 not having the lower electrode films 5 formed thereon. Further, upper electrode films 4 made of molybdenum (Mo) are patterned on the piezoelectric film 3.

The upper electrode films 4 and the lower electrode films 5 can be roughly divided into three types of regions: first regions serve as the upper electrodes for the series-arm resonators S1 through S4 and the parallel-arm resonators P1 through P3 (these regions being referred to as the electrode regions or the electrode parts); second regions connect the bandpass ladder filter element 1 to the outside (a conductor pattern 23 on the package 23) with bumps 13 (these regions being referred to as the "pad regions" or "pad parts"); and third regions electrically connect the electrode regions to one another or electrically connecting the electrode regions to the pad regions (the third regions being also referred to as the "wiring regions" or "wiring parts").

Also, cavities 6 each having approximately the same size as each of the series-arm resonators S1 through S4 are formed in the substrate 2, penetrating the parts immediately below the regions where the upper electrode films 4 overlap with the lower electrode films 5 (the regions being equivalent to the electrode regions). Although not shown in FIG. 7, a $SiO_2$ film is further formed on each of the upper electrode films of the laminated resonator parts of the parallel-arm resonators P1 through P3, so as to obtain bandpass filter characteristics in which the resonant frequencies of the series-arm resonators S1 through S4 are substantially equal to the antiresonant frequencies of the parallel-arm resonators P1 through P3.

As shown in FIGS. 6 and 7, bump connecting pads (also referred to as the "bump base layers") 11A through 11E each having a gold (Au) layer 11a and a titanium (Ti) layer 11b are formed on the upper electrode films 4. Bumps 13A through 13E made of gold (Au) are each formed on each corresponding one of the bump connecting pads 11A through 11E.

A conductive layer 14 having the same double-layered structure as each of the bump connecting pads 11A through 11E is formed on a part of an upper electrode film 4 connecting the series-arm resonators S2 and S3 and the parallel-arm resonator P2 (the region being the wiring region minus the series-arm resonators S2 and S3 and the parallel-arm resonator P2). With the conductive layer 14 formed on the wiring region on the upper electrode film 4, the resistance value of this region is reduced. Accordingly, the poor Q characteristics of the inductances in the bandpass ladder filter element 1 can be reduced, and the filter characteristics of the bandpass ladder filter element 1 can be improved. The upper and lower electrodes films 4 and 5 and the piezoelectric film 3 may be made of materials other than the above mentioned materials. The conductive layer 14 should preferably be made of a material that has a low resistance and can maintain the adhesion of the upper and lower electrode films 4 and 5 and the bumps 13. In other words, the conductive layer 14 may be made of any material that has a low resistance and is compatible with the materials of the electrode films and the material of the bumps that form the laminated resonators of the piezoelectric thin-film resonators, or any low-resistance material that enhances the adhesion of the electrode films and the bumps and does not form an unnecessary alloy layer. In view of this, the bumps 13 are made of gold (Au), and the conductive layer 14 is preferably a double-layered film of Au and Ti, a double-layered film of Au and Cr, or the like. Also, the thickness of each layer and the sizes of the series-arm resonators and parallel-arm resonators may be arbitrarily changed according to a desired frequency.

The length-width ratio in the wiring regions that connect the series-arm resonators S1 through S4, the parallel-arm resonators P1 through P3, and the bump connecting pads 11A through 11E, will now be explained.

In the bandpass ladder filter element 1 shown in FIG. 6, the shortest possible length of the wiring regions that connect the series-arm resonators S1 through S4 to one another is 20 $\mu$m, while the width of each of these wiring regions is 160 $\mu$m. In FIG. 6, the X–X' direction is the length direction, and the direction perpendicular to the X–X' direction is the width direction. With this structure shown in FIG. 6, the length-width ratio in the wiring regions becomes 0.125.

In the bandpass ladder filter element 1 shown in FIG. 6, the shortest possible length between the parallel-arm resonator P2 and the bump connecting pads 11 is 80 $\mu$m, while the width of each corresponding wiring region is 160 $\mu$m. In FIG. 6, the X–X' direction is the width direction, and the direction perpendicular to the X–X' direction is the length direction. With this structure, the length-width ratio in the wiring region becomes 0.5.

By restricting the length-width ratio in each wiring region to a small value (3 or smaller, for example) in the above manner, the resistance value of each wiring region is reduced, and the poor Q characteristics of the inductances in the bandpass ladder filter element 1 can be reduced. Thus, the filter characteristics of the bandpass ladder filter element 1 can be improved. The length-width ratio should preferably be 3 or smaller, as described above. If the length-width ratio is greater than 3, it would be difficult to obtain desired filter characteristics. Also in the other regions, the length-width ratio of each of the wiring regions among the resonators and between the resonators and the bump connecting pads should be 3 or smaller.

The equivalent circuit of the bandpass ladder filter element 1 having the above structure is shown in FIG. 8. As can be seen from FIG. 8, the series-arm resonators S1 through S4 and the parallel-arm resonators P1 through P3 are connected to one another, as the inductance components in the element are made so small to be ignored.

In the above structure, the upper electrode films 4 and the lower electrode films 5 may be made of aluminum (Al), copper (Cu), molybdenum (Mo), tungsten (W), tantalum (Ta), platinum (Pt), ruthenium (Ru), rhodium (Rh), iridium (Ir), or the like. The piezoelectric film 3 may be made of aluminum nitride (AlN), zinc oxide (ZnO), lead zirconate titanate (PZT), lead titanate (PbTiO$_3$), or the like. The substrate 2 may be made of silicon, glass, or the like.

Figure 9:
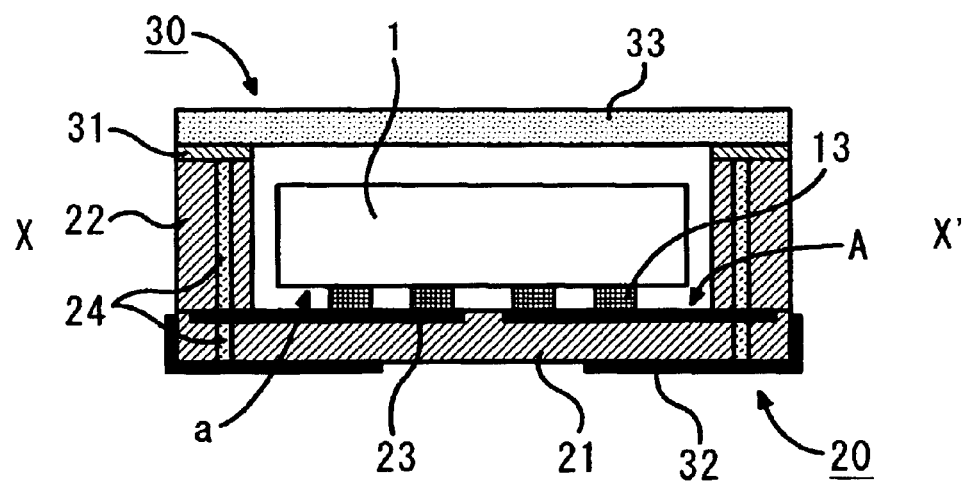
FIG. 9 is a section view of a bandpass filter device having the bandpass ladder filter element of FIG. 6 housed in a package, taken along the line X–X'.
Figure 10:
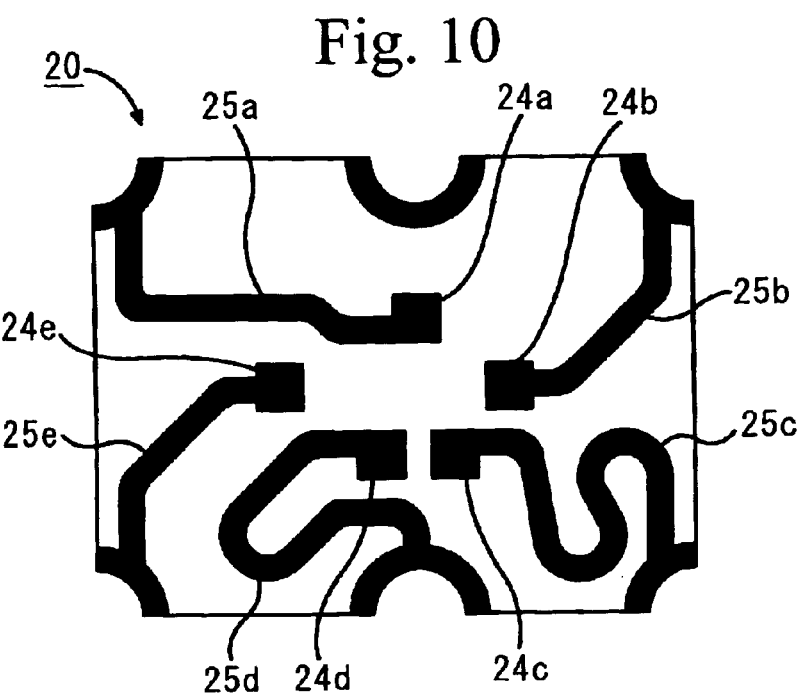
FIG. 10 is a top view showing the die-attach face of the package shown in FIG. 9.

Referring now to FIGS. 9 and 10, a package 20 that houses the bandpass ladder filter element 1 will be described. FIG. 9 is a schematic section view of a bandpass filter device 30 that has the bandpass filter element 1 housed in the package 20, taken along the line X–X' of FIG. 6. FIG. 10 is a top view of the package 20, showing the die-attach face A.

As shown in FIG. 9, the bandpass ladder filter element 1 is face-down bonded to the die-attach face A of the package 20 with the bumps 13A through 13E.

The package 20 includes a bottom plate 21 that hold the bandpass ladder filter element 1 in a face-down state, and side walls 22 that surround the bandpass ladder filter element 1 held on the bottom plate 21. The package 20 is made of LTCC (Low Temperature Co-fired Ceramics) glass ceramics having a dielectric constant of 7.5. Alternatively, the package 20 may be made of glass ceramics having a dielectric constant of 4 to 8, alumina (aluminum oxide) ceramics having a dielectric constant of 8 to 11, or the like. To reduce stray capacitance that degrades the filter characteristics, it is preferable to use glass ceramics having a lower dielectric constant. As glass ceramics can be sintered at a low temperature, the use of glass ceramics is more preferable. With the material that can be sintered at a low temperature, a conductive material having a low resistivity, such as copper (Cu) or gold (Ag), can be used as the material to form the conductor pattern in the package.

The conductor pattern 23 that is a 15-$\mu$m thick copper (Cu) film and serves as microstrip-line transmission paths is formed on the die-attach face A of the package 20. Also, vias 24 made of copper (Cu) are formed at predetermined locations in the package 20. The exposed parts of the conductor pattern 23 made of Cu is plated with a double-layered film of gold (Au) and nickel (Ni). Generally, a microstrip line is a structure having an insulator layer sandwiched between a line path pattern and a ground solid film. In this embodiment, however, a microstrip line may not have a ground solid film covering the entire area of one side, or may have a line path sandwiched between ground solid films.

Referring now to FIG. 10, the conductor pattern 23 of the package 20 will be described in greater detail. As shown in FIG. 10, the conductor pattern 23 includes bump connecting pads 24a through 24e, and transmission paths 25a through 25e extending from the bump connecting pads 24a through 24e, respectively. In this description, the transmission paths 25a through 25e will be hereinafter referred to as the "microstrip lines 25a through 25c". The microstrip lines 25a through 25e should preferably have a conductive material of a low resistivity as a main component, so as to reduce resistance losses. Specific examples of such materials include Cu and Ag.

In this structure, the bumps 13A through 13E formed on the bump connecting pads 11A through 11E of the bandpass ladder filter element 1 shown in FIG. 6 are bonded to the bump connecting pads 24a through 24E, respectively. It is preferable that only one of the bumps 13A through 13E is used for each connecting process. By performing a connecting process with only the minimum number (which is 1) of bumps, the areas of the bump connecting pads 11A through 11E and 24a through 243 can be minimized, and the generation of stray capacitance can be prevented.

The bump connecting pads 24a through 24e of the package 20 each has a square shape, with each side being 20 $\mu$m long. This is approximately 350% in size in relation to the placement area of each bump 13, which is approximately 120 $\mu$m$\phi$, with a margin being allowed for the positioning accuracy in the production process. In this embodiment, however, the area of each of the bump connecting pads 24a through 24e should preferably be one to six times larger than the placement area of each bump 13. Only after this condition is satisfied, can the following conditions be also satisfied: a space that is wide enough to accommodate longer microstrip lines can be secured; sufficient inductances for improving the filter characteristics can be obtained when the package is made smaller in size; a great length can be maintained between each two neighboring ones of the bump connecting pads 24a through 24e, and between each of the bump connecting pads 24a through 24e and each corresponding one of the microstrip lines 25a and 25e in the package 20; and the facing areas between the electrode pattern regions (the upper and lower electrode films 4 and 5) of the face-down-mounted bandpass ladder filter element 1 and the bump connecting pads 24a and 24e on the die-attach face A. With a structure that satisfies the above conditions, longer microstrip lines can be formed, and sufficient inductances for improving characteristics can be obtained in a smaller package. Thus, generation of more stray capacitance can be prevented.

Each of the microstrip lines 25a through 25e is 100 $\mu$m in width. The widths of the microstrip lines 25a through 25e should preferably be in the range of 50 $\mu$m to 150 $\mu$m. If each of the microstrip lines 25a through 25e is 150 $\mu$m or greater in width, unnecessary stray capacitance increases, resulting in poorer filter characteristics. If each of the microstrip lines 25a through 25e is 50 $\mu$m or smaller in width, it is difficult to form the microstrip lines with good reproducibility. Therefore, the above condition (the widths of the microstrip lines 25a through 25e being in the range of 50 $\mu$m to 150 $\mu$m) is set as standards.

Each of the microstrip lines 25a through 25e takes the form of a serpentine line without sharp corners. With the curved lines in the microstrip lines 25a through 25e, the Q factor of the inductance can be made higher than the Q factor obtained with linear microstrip lines. As a result, the filter characteristics can be improved.

Most of the microstrip lines 25a through 25e, for example, more than 80% of the microstrip lines 25a through 25e, are formed in regions outside the regions facing the electrode pattern regions (the upper and lower electrode films 4 and 5) of the bandpass ladder filter element 1. With this structure, most of the microstrip lines 25a through 25e on the die-attach face A are formed in regions that do not face the upper electrode film 4 of the bandpass ladder filter element 1 that is face-down mounted in the package 20, and accordingly, the generation of stray capacitance can be prevented.

In the above structure, the upper and lower electrode films 4 and 5 of the face-down mounted bandpass ladder filter element 1 hardly face the conductor pattern 23 on the die-attach face A. Accordingly, the generation of stray capacitance can be prevented by the upper and lower electrode films 4 and 5 and the conductor pattern 23, and inductances formed by the microstrip lines 25a through 25e are given to the predetermined series-arm and parallel-arm resonators of the bandpass ladder filter element 1. Also, with the microstrip lines 25a through 25e in the form of serpentine lines having no sharp corners, the Q characteristics of inductances can be improved.

As the microstrip lines 25a through 25e are formed on the die-attach face A of the package 20, an air layer is formed on one side of each of the microstrip lines 25a through 25e. Accordingly, the generation of stray capacitance can be prevented, and the structure of the package 20 is simplified, thereby preventing increases in production cost.

Figure 11:
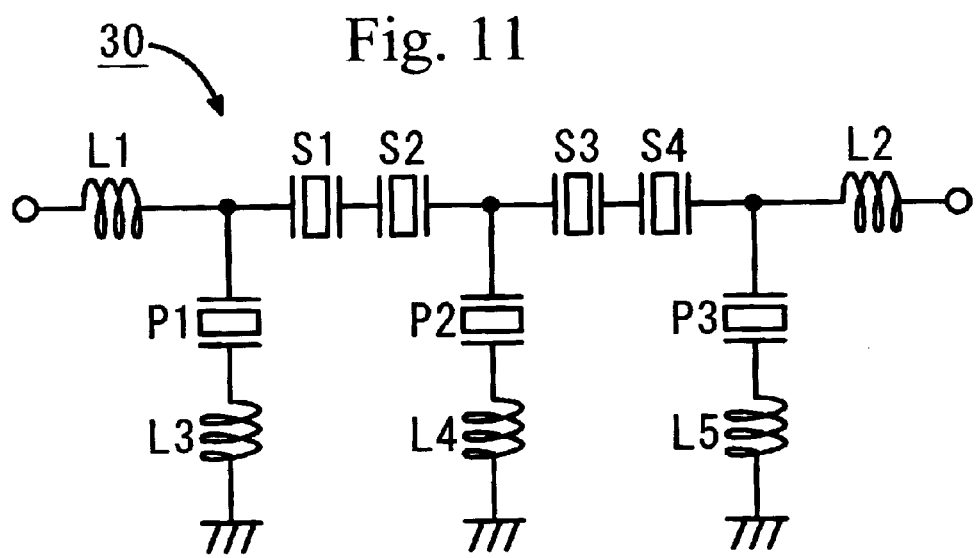
FIG. 11 shows an equivalent circuit of the bandpass filter device shown in FIG. 9.

FIG. 11 shows the equivalent circuit of a bandpass filter device 30 that has the bandpass ladder filter element 1 housed in the package 20. As shown in FIG. 11, the package 20 having the above described inductance components is connected to the bandpass ladder filter element 1 having inductance components reduced to an ignorable size, so that the bandpass filter device 30 having inductances L1 through L5 with excellent Q characteristics connected in series with the resonators S1 through S4 and P1 through P3 can be formed. This bandpass filter device 30 is a small-size bandpass filter device that exhibits excellent filter characteristics in a broader band area and is highly restrained in the vicinity of pass bands. The locations and sizes of the inductances to be added can be arbitrarily changed in accordance with desired filter characteristics.

The microstrip lines 25a, 25c, and 25d, which are connected to the parallel-arm resonators P1 through P3, are also connected to conductive seal rings 31 formed on the top faces of the side walls 22 through the vias 24 penetrating the side walls 22 over the die-attach face A. Thus, the microstrip lines 25a, 25c, and 25d, electrically communicate with the conductive seal rings 31.

The microstrip lines 25a through 25e on the die-attach face A are also connected to a foot pattern 32 through the vias 24 or castellation conductors formed on the side walls 22. The foot pattern 32 is formed on the bottom surface of the package 20, and functions as connection terminals for external circuits.

A conductive cap member 33 is also mounted on the package 20, with the conductive seal ring 31 being interposed in between. The conductive cap member 33 covers the cavity formed by the side walls 22, so that the inside of the cavity can be sealed from the outside. The inside of the cavity is evacuated or filled with dry nitrogen.

Figure 12:
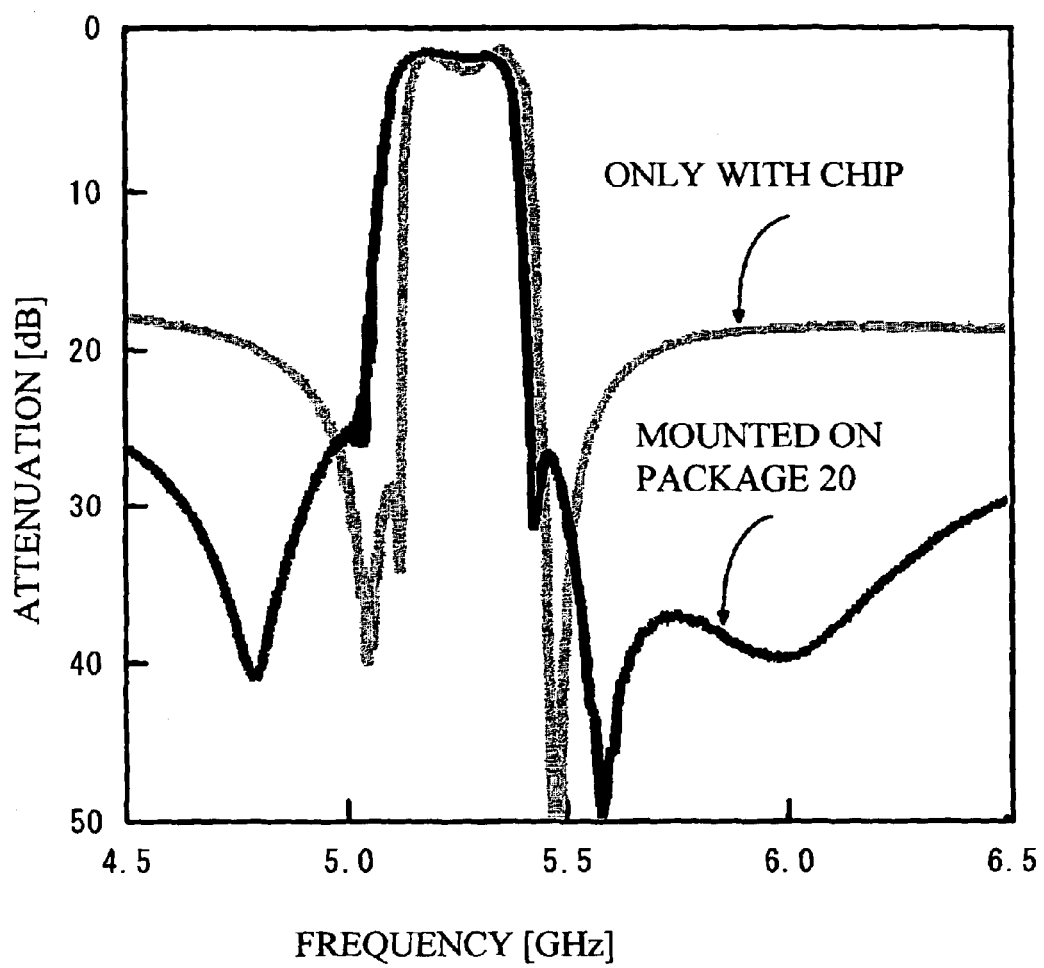
FIG. 12 is a graph showing the characteristics obtained only with the chip of the bandpass ladder filter element, and the characteristics obtained with the chip mounted on the package.

FIG. 12 shows the characteristics obtained with only the chip of the bandpass ladder filter element 1, and the characteristics obtained when the chip is mounted on the package 20. As is apparent from FIG. 12, with the chip being mounted on the package 20, filter characteristics can be obtained in a broader band area, but are highly restrained in the vicinity of pass bands. With the structure in accordance with this embodiment, a bandpass filter device can exhibit filter characteristics in a broader band area, and the filter characteristics can be highly restrained in the vicinity of pass bands.

Although a bandpass ladder filter element has been described so far, the present invention may be applied to filter elements having other circuit structures, such as lattice filter elements.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A filter device comprising:
a filter element that has a plurality of piezoelectric thin-film resonators arranged in series arms end parallel arms; and
a package that houses the filter element in a face-down state,
the filter element and the package being electrically connected to each other through bumps,
the package having a plurality of first pad parts on which the bumps are placed, and a plurality of transmission paths that electrically connect the first pad parts to the outside,
the filter element having a plurality of second pad parts that are electrically connected to the first pad parts through the bumps, and a plurality of wiring parts that electrically connect the second pads to the piezoelectric thin-film resonators and electrically connect the piezoelectric thin-film resonators to one another, and
inductances formed with the transmission paths being connected in series to the piezoelectric thin-film resonators,
wherein the area of each of the first pad parts is one to six times larger than the placement area of each corresponding one of the bumps, and
wherein the transmission paths are formed under the filter element on a die-attach face of the package.

2. The filter device as claimed in claim 1, wherein each of the wiring parts has a thickness increased by an addition of a conductive layer.

3. The filter device as claimed in claim 1, wherein each of the second pad parts has a thickness increased by an addition of a pad base layer.

4. The filter device as claimed in claim 3, further comprising conductive layers formed on the wiring parts connecting the second pad parts to the piezoelectric thin-film resonators, wherein the conductive layers are integrally formed with the pad base layers.

5. The filter device as claimed in claim 3, further comprising conductive layers formed on the wiring parts connecting the piezoelectric thin-film resonators to one another, wherein each of the conductive layers has the same layer structure as each of the pad base layers.

6. The filter device as claimed in claim 2, wherein each of the conductive layers has a double-layered structure.

7. The filter device as claimed in claim 1, wherein each of the wiring parts has a length-width ratio of 3 or smaller.

8. The filter device as claimed in claim 1, wherein:
the piezoelectric thin-film resonators arranged in series arms are aligned in a row; and
at least one of the piezoelectric thin-film resonators arranged in parallel arms is placed on one side of the row of the piezoelectric thin-film resonators arranged in series arms, while the other piezoelectric thin-film resonators arranged in parallel arms are placed on the other side of the row.

9. The filter device as claimed in claim 1, wherein each of the first pad parts is connected to each corresponding one of the second pad parts through each corresponding one of the bumps.

10. The filter device as claimed in claim 1, wherein at least 80% of the transmission paths are formed on regions that do not face regions of the filter element in which the wiring parts, the pad parts, and the piezoelectric thin-film resonators are formed.

11. The filter device as claimed in claim 1, wherein the package has glass ceramics as a main component.

12. The filter device as claimed in claim 1, wherein the line widths of the transmission paths are In the range of 50 $\mu$m to 150 $\mu$m.

13. The filter device as claimed in claim 1, wherein each of the transmission paths has copper or silver as a main component.

14. The filter device as claimed in claim 1, wherein each of the transmission paths has at least one curved part.

15. The filter device as claimed in claim , wherein the filter element has the piezoelectric thin-film resonators arranged in a ladder-like fashion.

16. The filter device as claimed in claim 1, wherein the filter element has the piezoelectric thin-film resonators arranged in a lattice-like fashion.

17. The filter device as claimed in claim 1, wherein the package includes:
a bottom part that holds the filter element in a face-down state;
side wall parts that surround the filter element held on the bottom part;
conductive seal rings that are formed over the side wall parts; and
a conductive cap member that seals a concavity formed by the bottom part and the side wall parts, with the conductive seal rings being interposed.

18. The filter device as claimed in claim 1, wherein the package includes:
a bottom part that holds the filter element in a face-down state;
side wall parts that surround the filter element held on the bottom part;
conductive seal rings that are formed over the side wall parts;
a conductive cap member that seals a concavity formed by the bottom part and the side wall parts, with the conductive seal rings being interposed; and
vias that penetrate the side wall parts from the bottom part to the conductive seal rings,
the transmission paths being connected to the conductive seal rings through the vias.

19. The filter device as claimed in claim 1, wherein the transmission paths have portions that extend outwards beyond the filter element.

* * * * *